United States Patent
Cutter

[19]

[11] Patent Number: 5,864,167
[45] Date of Patent: Jan. 26, 1999

[54] SEMICONDUCTOR DEVICE

[75] Inventor: John R. Cutter, Macclesfield, England

[73] Assignee: U.S. Philips Corporation, New York, N.Y.

[21] Appl. No.: 8,335

[22] Filed: Jan. 16, 1998

[30] Foreign Application Priority Data

Jan. 17, 1997 [GB] United Kingdom .................... 9700923

[51] Int. Cl.⁶ ................................................. H01L 23/58
[52] U.S. Cl. ......................... 257/489; 257/487; 257/488; 257/490; 257/494; 257/495; 257/630
[58] Field of Search .................................... 257/487, 488, 257/489, 490, 491, 492, 493, 494, 495, 496, 630, 629

[56] References Cited

U.S. PATENT DOCUMENTS

| | | | |
|---|---|---|---|
| 4,691,224 | 9/1987 | Takada | 257/490 |
| 4,707,719 | 11/1987 | Whight | 357/53 |
| 4,927,772 | 5/1990 | Arthur et al. | 437/6 |
| 4,954,868 | 9/1990 | Bergmann et al. | 357/53 |
| 5,086,332 | 2/1992 | Nakagawa et al. | 257/489 |
| 5,552,625 | 9/1996 | Murakami et al. | 257/487 |

FOREIGN PATENT DOCUMENTS 083001709  5/1983  Germany ................. 257/490

*Primary Examiner*—Tom Thomas
*Assistant Examiner*—William Hughes
*Attorney, Agent, or Firm*—Steven R. Biren

[57] ABSTRACT

In a MOSFET or other high voltage device, an annular channel stopper (4) extends around the outer periphery (14) of a body portion (11) with which a device region (15) forms a p-n junction (5) operable under high reverse bias in at least one mode of operation of the device. A field plate structure (34, 34a, 34b, 34c) on an insulating layer (24) over the body portion (11) extends towards the outer periphery (14) to spread a depletion layer from the reverse-biased p-n junction (5) towards the outer periphery (14). The channel stopper (4) comprises concentrically doped stopper regions (41 to 44) with different doping concentrations and/or region widths and/or spacings, giving to the body portion (11) a non-uniform doping profile the doping of which, under the field plate structure (34, 34a, 34b, 34c), increases with distance (D) towards the outer periphery (14) to slow progressively the spread of the depletion layer under the field plate structure (34, 34a, 34b, 34c). This field plate structure (34, 34a, 34b, 34c) connected to the device region (15) and/or to a field region (35) can extend laterally over the whole of the body portion (11) between the device region (15) and a doped channel stopper region (41) in the vicinity of the outer periphery (14), and without the complication of any field plate connected to the channel stopper (4).

10 Claims, 1 Drawing Sheet

SEMICONDUCTOR DEVICE

BACKGROUND OF THE INVENTION

This invention relates to semiconductor devices, for example rectifier diodes, MOSFETs (insulated-gate field-effect transistors), bipolar transistors, IGBTs (insulated-gate bipolar transistors) and thyristors, each having a p-n junction which terminates at a major surface of a semiconductor body and which may be operated under high reverse bias (for example in excess of 200 volts) in at least one mode of operation of the device.

U.S. Pat. No. 4,707,719 (our reference PHB 33126) discloses a semiconductor device comprising a semiconductor body having a body portion of one conductivity type adjacent a major surface of the body, a device region of the opposite conductivity type adjacent said major surface and forming with the body portion a reverse-biased p-n junction which terminates at said major surface, the body portion extending from the device region to an outer periphery of the body portion, and an annular channel stopper extending around the vicinity of the outer periphery. The annular channel stopper disclosed in U.S. Pat. No. 4,707,719 consists of a single doped stopper region 14 of the one conductivity type which is present in the body portion 12 adjacent the upper major surface of the body 10 and which has a higher conductivity type determining doping concentration than the body portion 12. The whole contents of U.S. Pat. No. 4,707,719 are hereby incorporated herein as reference material.

As described in U.S. Pat. No. 4,707,719 the basic device structure may be used for various types of semiconductor device, for example a power rectifier diode, a MOSFET, a bipolar transistor, or a thyristor. The p-n junction 20 is reverse-biased to block voltage in the "off" state of the device. In order to terminate at said major surface, the p-n junction 20 bends towards the surface, so increasing the electric field and reducing the voltage that the device can withstand as compared with that obtainable from a plane (unbent) p-n junction. Some peripheral termination measures are necessary around the bent p-n junction 20 in order to attain the maximum possible blocking voltage when the device is first manufactured (the so-called "zero-hour voltage") and to maintain it during the working life of the device. The blocking voltage is increased by increasing the effective radius of curvature of the p-n junction 20, by an appropriate design of the peripheral termination measures to spread the depletion layer 30 of the p-n junction 20 along the surface of the body portion 12. Ideally, the peripheral termination should be designed to occupy the minimum possible area of the semiconductor body, provide as much of the plane breakdown voltage as possible, be stable over the working life of the device, and cost as little as possible to provide in manufacture.

The peripheral termination measures disclosed in U.S. Pat. No. 4,707,719 include the provision of a resistive overlayer 28 on an insulating layer 18 over the whole semiconductor body surface between the channel stopper region 14 of the one conductivity type and the device region of the opposite conductivity type. This resistive overlayer 28 acts as a field plate to spread the depletion layer from the reverse-biased p-n junction 20 towards the outer periphery. At least one field region 1–6 of the opposite conductivity type is also provided between the annular channel stopper region 14 and the device region 11, surrounds the device region 11 and forms with the body portion 12 of the one conductivity type a p-n junction 21–26 terminating at said major surface. The field regions 1–6 also control the spread of the depletion layer 30 in the body portion.

The resistive overlayer 28 on the insulating layer 18 provides also an effective means for electrically screening the underlying body surface from external changes and for inhibiting the diffusion of contaminating ions into the peripheral termination from, for example, a plastics encapsulation around the semiconductor body 10. In the absence of the measures 18 and 28, these external changes and contaminating ions can undesirably alter the internal fields in the peripheral termination area, so changing the blocking voltage characteristics of the device during its working life. The peripheral termination measures (1–6,14,18,28) disclosed in U.S. Pat. No. 4,707,719 are particularly effective, because they screen the whole body surface from the device region to the outer periphery and because the potential variation along the semiconductor body surface is matched to that in the resistive overlayer. However, these measures may occupy quite a large peripheral area of the semiconductor body. Furthermore, there is a leakage current which flows through the resistive overlayer 28, across the blocking p-n junction 20.

U.S. Pat. No. 4,954,868 discloses an alternative approach in which (instead of a resistive overlayer) discrete field plates are used connected to various regions of the device. The whole contents of U.S. Pat. No. 4,954,868 are hereby incorporated herein as reference material. The annular channel stopper in the device of U.S. Pat. No. 4,954,868 is a field plate 7 rather than a doped region of the semiconductor body 1. The blocking p-n junction 3 of the device is covered by a field electrode 6. The blocking voltage is increased by arranging a further channel-stopper field plate 19 over the channel stopper 7 and an anode field plate 18 over the field electrode 6. These field plates 18 and 19 extend towards each other on a further insulating layer 16. This further insulating layer 16 is not of uniform thickness. The thickness of the insulating layer 16 is larger between the field plates 18 and 19 than it is over the field electrode 6 and channel stopper 7.

A gap c is present between the field plates 18 and 19 of the device of U.S. Pat. No. 4,954,868. The increased dielectric thickness for the insulating layer 16 around the gap c reduces capacitive coupling between charges at the top surface of the dielectric and the underlying major surface of the semiconductor body. The gap c is advantageous in that it inhibits leakage current across the blocking junction 3, through the field plates 18 and 19. However, the requirement for such a gap c prevents the peripheral termination measures from covering the whole of the semiconductor body surface from the blocking p-n junction 3 to the channel stopper 7. Furthermore, the need to provide a further dielectric layer 16 of differing thickness below the field plates 18 and 19 can be inconvenient in manufacture, and the control of the increased thickness for this dielectric layer 16 may become a critical process parameter.

SUMMARY OF THE INVENTION

It is an aim of the present invention to provide a novel termination measure which can be adopted at low cost, does not require a large extra area of the body surface for its accommodation, and which is compatible with providing effective measures over the whole body surface between the annular channel stopper and the device region.

According to the present invention there is provided a semiconductor device comprising a semiconductor body having a body portion of one conductivity type adjacent a major surface of the body, a device region of the opposite conductivity type adjacent said major surface and forming with the body portion a p-n junction which terminates at said major surface, the p-n junction being reverse-biased in at least one mode of operation of the device, the body portion extending from the device region to an outer periphery of the body portion, a field plate structure extending on an insulating layer over the body portion towards the outer periphery to spread a depletion layer from the reverse-biased p-n junction towards the outer periphery, and an annular channel stopper extending around the vicinity of the outer periphery to prevent the spread of the depletion layer to the outer periphery, characterised in that the field plate structure terminates on the insulating layer over the annular channel stopper, the annular channel stopper comprises concentrically doped stopper regions of the one conductivity type which are present in the body portion adjacent the said major surface and which have a higher conductivity type determining doping concentration than the body portion, and the concentrically doped stopper regions together give to the body portion adjacent the said major surface a non-uniform doping profile of the one conductivity type the doping of which, under the field plate structure, increases with distance towards the outer periphery to slow progressively the spread of the depletion layer under the field plate structure.

With such a device structure in accordance with the invention, there is no need to provide any field plate or resistive overlayer connected to the channel stopper, because the annular channel stopper region itself comprises concentrically doped stopper regions giving to the body portion a non-uniform doping profile of the one conductivity type which increases in doping towards the outer periphery of the body portion. Such a device structure is compatible with (and so permits the inclusion in accordance with the invention of) a field-plate structure which may be connected to the device region and/or to a field region and which can extend laterally outward on the insulating layer over the whole of the body portion between the device region and a doped stopper region of the annular channel stopper in the vicinity of the outer periphery of the body portion.

In one form at least some of the doped stopper regions may comprise concentric distinct regions of higher conductivity type determining dopant concentration than the body portion, which distinct regions are spaced from each other in the body portion adjacent the said major surface. These distinct regions may be spaced from each other by distances which are smaller towards the outer periphery than nearer the device region. Alternatively, or additionally, these distinct regions may have widths which are larger for a distinct region towards the outer periphery than for a distinct region nearer the device region. The different spacings and widths of these distinct stopper regions can be readily defined by the layout pattern in a mask (for example a diffusion or implantation mask) used for the fabrication of the annular channel stopper.

In another form, at least some of the concentrically doped stopper regions may have different conductivity type determining dopant concentrations which are greater for a region towards the outer periphery than for a region nearer the device region. These different dopant concentrations can be formed in the same dopant introduction stage, through differently sized apertures in a mask (for example a diffusion or implantation mask) used for the fabrication of the annular channel stopper. These concentrically doped stopper regions of different dopant concentration may be distinct regions in the body portion. However, at least some of these regions may merge laterally together to form a compound region for which the doping profile has a greater conductivity type determining dopant concentration towards the outer periphery than nearer the device region.

The outer periphery of the body portion may be an outer periphery of the body, or it may be an outer periphery of an island of the one conductivity type bounded in the body by an isolation region of the opposite conductivity type.

BRIEF DESCRIPTION OF THE DRAWING

These and other features in accordance with the present invention, and their advantages are illustrated specifically in embodiments of the invention now to be described, by way of example, with reference to the accompanying diagrammatic drawings, in which.

Figure 1:
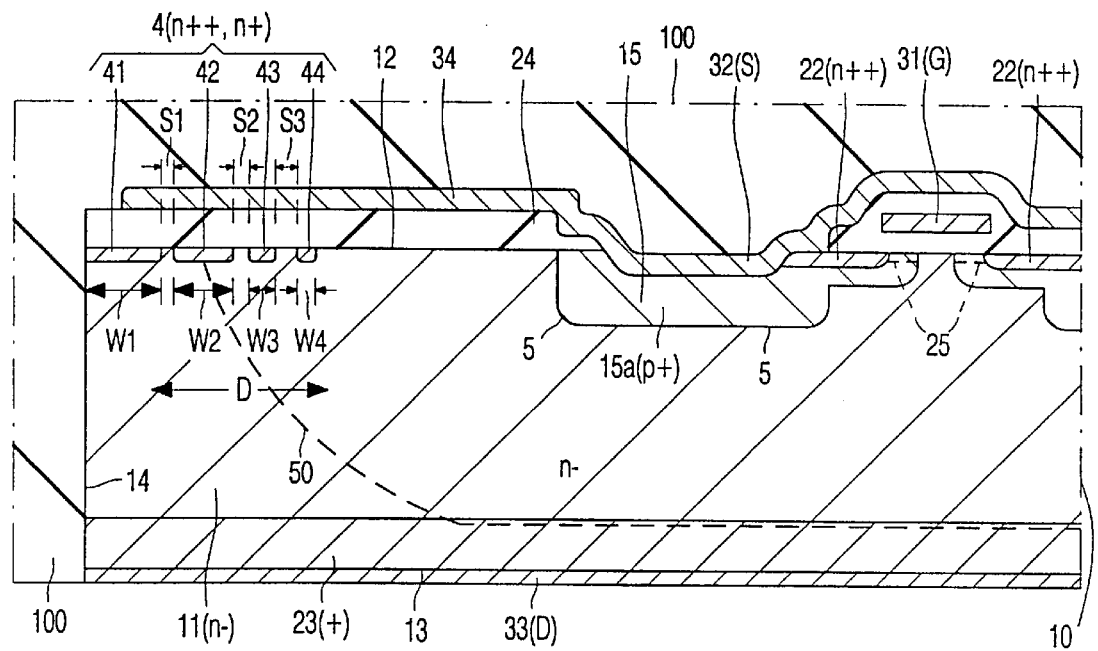
FIGS. 1 to 3 are cross-sectional views of part of a semiconductor device in accordance with different embodiments of the present invention.
Figure 2:
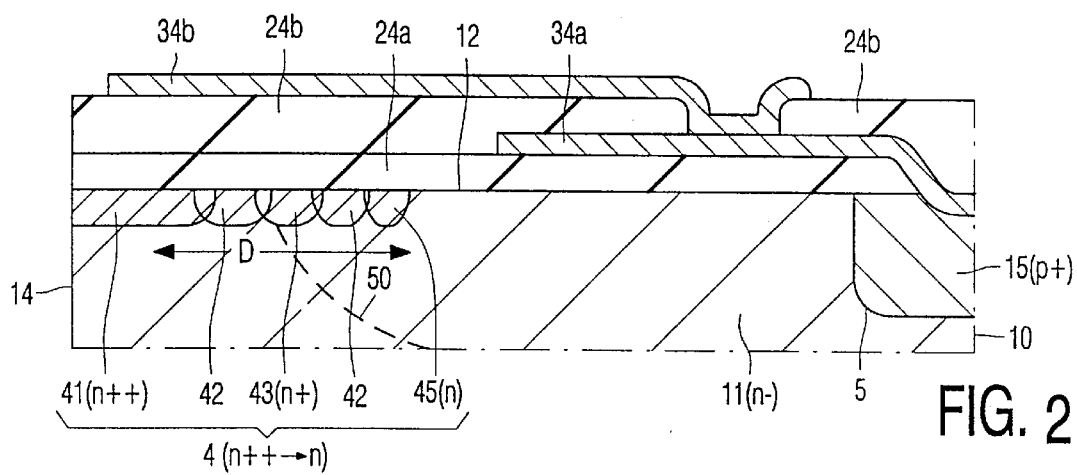
Figure 3:
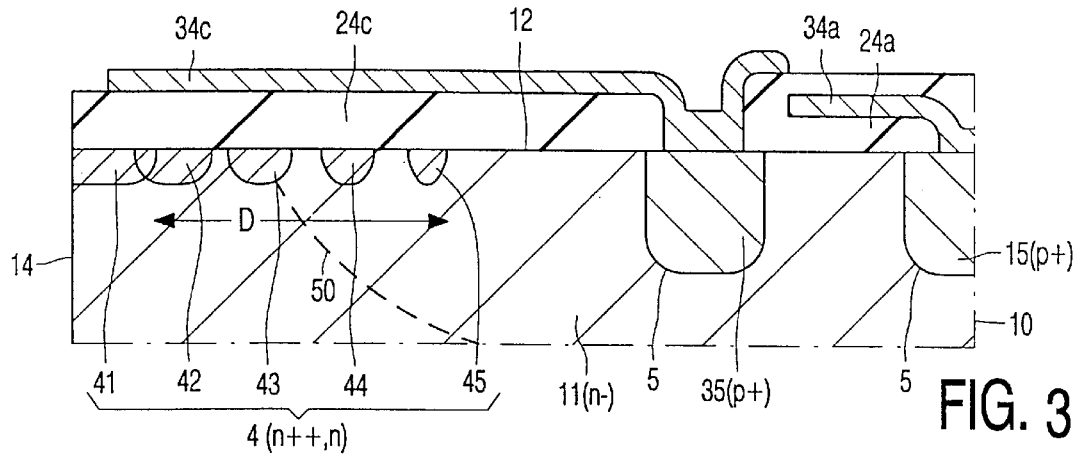

It should be noted that the FIGS. 1 to 3 are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in the different embodiments.

DESCRIPTION OF THE PREFERRED EMBODIMENTS

Each of the devices of FIGS. 1 to 3 comprises a semiconductor body 10 having a body portion 11 of one conductivity type (for example n type) adjacent a major surface 12 of the body 10, a device region 15 of the opposite conductivity type (for example p type) adjacent said major surface 12 and forming with the body portion 11 a p-n junction 5 which terminates at said major surface 12, the body portion 11 extending from the device region 15 to an outer periphery 14 of the body portion 11. A field plate structure 34 (also 34a,34b,34c) extends on an insulating layer 24 (also 24a,24b,24c) over the body portion 11 towards the outer periphery 14 to spread a depletion layer 40 from the reverse-biased junction 5 along the surface 12 towards the outer periphery 14 of the body portion 11. This field-plate structure increases the effective radius of curvature of the p-n junction 5 where it bends to the surface 12. In order to prevent the spread of the depletion layer 50 to the outer periphery 14, there is provided an annular channel stopper 4 extending around the vicinity of the outer periphery 14.

In accordance with the present invention the channel stopper 4 in each of the devices of FIGS. 1 to 3 comprises concentrically doped plural stopper regions 41,42, . . . etc of the one conductivity type (for example n type) present in the body portion 11 adjacent the said major surface 12, each doped stopper region having a higher conductivity type determining dopant concentration than the body portion 11. The field-plate structure 34 (see also 34b,34c) terminates on the insulating layer 24 over this channel stopper 4, without leaving any lateral gap therebetween over the body portion 11. The concentrically doped stopper regions 41,42 . . . etc have different doping concentrations and/or region widths W1,W2 . . . etc and/or spacings S1,S2 . . . etc which give to the body portion 11 a non-uniform doping profile adjacent the major surface 12. The doping of this non-uniform doping profile under the field plate structure 34 (also 34b,34c) increases progressively with distance D towards the outer periphery 14 to slow progressively the spread of the depletion layer 50 under the field plate structure with increasing reverse bias of the junction 5. Thus, the present invention provides a graded channel stopper effect which gradually counters the effect of the field plate structure in spreading the depletion layer 50 towards the periphery 14. The different doping concentrations and/or region widths and/or spacings of the concentrically doped stopper regions 41,42, . . . etc together give to the body portion 11 adjacent the said major surface 12 a succession of areas encountered by the depletion layer 50, the successive areas having a doping density (corresponding to an averaged magnitude of its conductivity type determining doping) which decreases with distance D along the said major surface 12 from the vicinity of the outer periphery 14 towards the device region 15.

By way of one specific example, FIG. 1 illustrates the use of the present invention for a vertical MOSFET. The MOSFET of FIG. 1 has a source electrode 32 adjacent the upper major surface 12 of the body 10, and a drain electrode 33 at the opposite major surface 13 of the body 10. The particular MOSFET illustrated in FIG. 1 is an n-channel enhancement device of so-called "DMOST" configuration, in which the device region 15 forms a so-called "transistor-body" region of the MOSFET. The transistor-body region 15 comprises a highly doped portion 15a (p+) which is contacted by the source electrode 32 and a lower doped portion 15b (p) in which an inversion channel 25 is formed in operation of the transistor. The source electrode 32 contacts an n type source region 22 present in the transistor-body region 15. In the on state of the transistor an n type inversion channel 25 is induced in the low doped p type portion 15b by electron accumulation below an insulated gate 31 and connects the source region 22 to the n type body portion 11. The p-n junction 5 between the transistor-body region 15 and the body portion 11 is reverse biased and forms a voltage blocking junction in the "off" state of the MOSFET. The body portion 11 has a low n type doping, for example of the order of $10^{14} cm^{-3}$ and forms a drain drift region of the transistor. A highly doped n type drain region 23 (n+) is present adjacent the opposite major surface 13 where it is contacted by the electrode 33. This MOSFET structure is of known type.

FIG. 1 shows part of only one cell of the MOSFET device, which may comprise several hundred cells in a typical device. The one cell illustrated in FIG. 1 is an outer cell located at the periphery of the active device area. The highly doped portion 15a (p+) of the transistor-body region 15 shown in FIG. 1 is of an annular configuration which extends in known manner around the whole outer perimeter of the active device area. Thus, this highly doped portion 15a shown in FIG. 1 is common to all the outer cells facing the outer periphery 14 of the body portion 11 (n−). In the FIG. 1 example the outer periphery 14 is an outer periphery of the device body 10. Thus, the annular channel stopper 4 (provided in accordance with the present invention) extends around the vicinity of the outer periphery 14 of the device body 10 in this example of FIG. 1. The MOSFET may be designed to operate with source to drain voltages in excess of 200 volts, for example about 600 or 1000 volts.

In the MOSFET of FIG. 1, the channel stopper 4 comprises concentric distinct regions 41,42,43,44 of higher conductivity type determining dopant concentration (n+) than the body portion 11 (n−). These distinct regions 41 to 44 are spaced from each other in the body portion 11 adjacent the major surface 12. They may have individual widths W1,W2,W3,W4 which are larger for a distinct region (e.g region 41) nearer the outer periphery 14 than for a distinct region (e.g region 44) nearer the device region 15. The individual spacings S1, S2, . . . etc. between these distinct regions 41 to 44 may be smaller for distinct regions (e.g 41 and 42) towards the outer periphery 14 than for distinct regions (e.g 43 and 44) nearer the device region 15. Being n+ (more highly doped n type) regions in an n type body portion 11, the doping concentration of each of these n+ regions 41 to 44 falls off in the n type body portion 11. The boundary of the width W of such an n+ region in an n type body portion 11 is normally defined by the location where the doping profile in the n+ region has decreased to twice the background doping level of the n type body portion. However it should be noted that other definitions of width W will generally give substantially the same values for the widths W1, W2, . . . etc. of the n+ regions 41 to 44, because the fall off in their doping level is spatially so very rapid unless special measures are taken as described with reference to JTE in FIG. 2. The background doping level of the body portion 11 is typically less than about $9 \times 10^{14} cm^{-3}$ to block a voltage of 200 volts with the reverse-biased p-n junction 5. Thus, the background doping level of the body portion 11 may be about $2 \times 10^{14} cm^{-3}$ for a device designed to blocking a voltage of 600 volts, and about $10^{14} cm^{-3}$ for blocking a voltage of 1,000 volts. The n+ regions 41 to 44 can be formed conveniently in the same doping step as the n+ source regions 22 and so may typically have the same doping concentration and the same depth as the regions 22. In this case, the n+ regions 41 to 44 may typically be formed by ion implantation of a dopant ion dose of about $2 \times 10^{15} cm^{-2}$ to a depth of about 1.0 to 1.5 μm (micrometres). Thus, for example, the n+ regions 41 to 44 may have a doping concentration of up to about $2 \times 10^{19} cm^{-3}$.

In a typical design, the distance D along the surface 12 over which the doping of the graded multi-region channel stopper 4 (under the field-plate structure 34) decreases towards the p-n junction 5 may be between a third and two-thirds of the distance along the surface 12 over which the field plate structure 34 extends. In this case, the depletion layer 50 is able to expand over about a third (or more) of the body portion 11 under the field plate structure 34 before beginning to encounter the increased doping concentration of the channel stopper 4 and is then subjected to progressive slowing over about another third (or more). FIG. 1 illustrates only a small number of concentrically doped regions 41 to 44 forming the channel stopper 4. Generally speaking, in order to soften the impact of the channel stopper 4 in slowing progressively the spread of the depletion layer 50, it can be advantageous to have a large number of small regions 41, 42, etc, rather than a small number of large regions. The individual widths W1, W2, . . . etc. of the regions 41, 42, . . . etc. may be typically of the order of 1 or several μm (micrometres). The individual spacings S1, . . . etc. between outermost regions 41 near the outer periphery 14 may be made so small that these outermost regions 41 merge together, with an enhanced doping level of the body portion 11 between these regions 41.

In the device arrangement illustrated by way of example in FIG. 1, the field plate structure 34 is connected to the device region 15 and extends laterally on the insulating layer 24 over the body portion 11 to overlie the annular channel stopper 4. In the particular example illustrated in FIG. 1, there is a single field plate 34 which extends from the device region 15 over all of the doped stopper regions 41,42,43 and 44. This field plate 34 extends over the whole of the body portion 11 to the vicinity of the outer periphery 14 and so can serve to screen the whole underlying surface portion against external electrical fields. Furthermore, the insulating layer 24 can be sufficiently thick over the whole underlying surface as to inhibit the diffusion of contaminating ions into the peripheral termination area of the surface 12. These external electrical fields and contaminating ions may result from, for example, a plastics encapsulation 100 around the semiconductor body 10. The single field plate 34 may be formed as part of the upper-level metallisation pattern of the device, for example, with aluminium or another metal.

Many modifications and variations are possible within the scope of the present invention. Two such modifications are illustrated in FIG. 2. In FIG. 2, the field plate structure 34 comprises plural field plates 34a and 34b in a stepped serial configuration. The first field plate 34a is connected to the device region 15 and extends on a first insulating layer 24a over the edge termination of the p-n junction 5. This first field plate 34a overlies only part of the body surface 12 between the device region 15 and the outer periphery 14. A second field plate 34b is connected to the first field plate 34a and extends on a second insulating layer 24b over a more peripheral area of the body surface 12. A stepped field plate structure 34a,34b results, in which the dielectric thickness of the insulating layer 24 increases with distance D along said major surface 12 from the device region 15 to the vicinity of the outer periphery 14. Such a stepped field plate structure 34a,34b may be used in the semiconductor device of FIG. 1. The first field plate 34a may be formed as part of, for example, a doped polycrystalline silicon lower-level metallisation pattern of the device. The second field plate 34b may be formed as part of, for example, an aluminium upper-level metallisation pattern. Thus, the stepped field plate structure 34a,34b can be formed using existing process steps in the manufacture of the device.

In the form illustrated in FIG. 2, the first field plate 34a does not extend over the channel stopper 4 but terminates on the insulating layer 24a over an area of the body portion 11 between the device region 15 and the channel stopper 4. The second field plate 34b terminates over a doped stopper region 41. The stepped field plate structure 34a,34b may be designed such that the first field plate 34a covers about a third of the distance from the p-n junction 5 towards the outer periphery 14, whereas the channel stopper 4 extends (below the second field-plate 34b) over about a third of the distance from the outer periphery 14 towards the p-n junction 5.

The channel-stopper 4 illustrated in FIG. 2 comprises concentrically doped stopper regions 41,42,43,44,45 which have individual different conductivity type determining dopant concentrations (n+++, n++, n, etc) which are higher than that (n−) of the body portion 11 but which are greater for a region (for example region 41) nearer the outer periphery 14 than for a region (for example region 45) nearer the device region 15. In the example illustrated in FIG. 2, these concentrically doped stopper regions 41 to 45 merge laterally together to form a compound region for which the doping profile has a greater conductivity type determining dopant concentration in the vicinity of the outer periphery 14 than nearer the device region 15. In a specific example of Figure 2 the donor doping concentration of this graded channel stopper 4 may increase from typically $5\times10^{14} cm^{-3}$ for region 45 to $10^{19} cm^{-3}$ for the outermost region 41.

This laterally-merged multiple-region graded doping profile of the channel stopper 4 of FIG. 2 may be formed in known manner in a single doping step using a mask having different patterns of openings exposing different fractions of the area of the semiconductor major surface 12 at different distances from the outer periphery 14. Such a method is described in U.S. Pat. No. 4,927,772, the whole contents of which are hereby incorporated herein as reference material. The disclosure in U.S. Pat. No. 4,927,772 relates to a multiple-region junction termination extension (JTE) region of a blocking p-n junction. The JTE region is of opposite conductivity type to the body portion and forms a p-n junction extension of the blocking p-n junction. However, in the FIG. 2 device in accordance with the present invention, the multiple-region graded doping profile of regions 41 to 45 is of the same conductivity type as the body portion 11 and extends from the region 41 at the outer periphery 14 towards the p-n junction 15. An existing doping step in the manufacture of the device may be used to provide this multiple-region graded doping profile of the channel stopper 4 through the mask pattern, for example, the doping step for source regions 22 of a MOSFET. No extra process steps are required, so economising on manufacturing costs. Such a multiple-region graded doping profile 41 to 45 may be used for the channel stopper 4 in the device of FIG. 1 instead of the distinct spaced regions 41 to 44 shown in FIG. 1.

In most cases where the present invention is applied, it will be unnecessary to take further special measures to control the field in the depletion layer 50 near the junction 5. However, the principle of the present invention in using a graded channel stopper 4 under an outwardly extending/terminated field plate 24,24b may be combined with known special measures to control the field near the junction 5. Thus, for example, FIG. 3 illustrates two further modifications in accordance with the present invention. In the device of FIG. 3 a field region 35 of the opposite conductivity type (p+) is provided between the annular channel stopper 4 (41,42,43,44) and the device region 15. This field region 35 surrounds the device region 15 and forms with the body portion 11 a p-n junction terminating at the major surface 12. FIG. 3 shows only part of one annular field region 35, but it should be understood that a concentric series of such field regions 35 may be included between the channel stopper 4 and the device region 15, for example, as in U.S. Pat. No. 4,707,719. One or more such field regions 35 may be included in the device structures of FIGS. 1 and 2.

By way of example, FIG. 3 also illustrates an outer field plate 34c connected to the field region 35 and extending laterally on an insulating layer 24c over the body portion 11 to overlie a doped stopper region 41,42,43,44. The device region 15 also includes an inner field plate 34a connected to the device region 15 and extending on an insulating layer 24a. The total field plate structure 34a and 34c may extend laterally over the whole of the body portion between the device region 15 and a doped stopper region 41,42,43,44 in the vicinity of the outer periphery 14. The semiconductor body 10 of the device of FIG. 3 may be packaged in a plastics encapsulation 100, in the same way as that of FIGS. 1 and 2.

The device regions 15 of FIGS. 2 and 3 may be transistor-body regions of a MOSFET similar to that of FIG. 1. Alternatively, the peripheral termination schemes of FIGS. 1, 2 and 3 may be used with other types of semiconductor device, for example a power rectifier diode in which the p-type region 15 forms an anode region and the n-type body portion 11 forms part of the cathode region. In another embodiment, the device may be a high voltage bipolar transistor, in which the p-type device region 15 forms part of the base region of the transistor and the body portion 11 forms part of the collector region. Furthermore, the devices of FIGS. 1 to 3 may be an insulated-gate bipolar transistor (IGBT) having, for example, an insulated-gate transistor structure similar to that of FIG. 1, but with the region 23 being of opposite conductivity type (p type in this example) to that (n−) of the drain drift region 11.

From reading the present disclosure, other modifications and variations will be apparent to persons skilled in the art.

Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A semiconductor device comprising a semiconductor body having a body portion of one conductivity type adjacent a major surface of the body, a device region of the opposite conductivity type adjacent said major surface and forming with the body portion a p-n junction which terminates at said major surface, the p-n junction being reverse-biased in at least one mode of operation of the device, the body portion extending from the device region to an outer periphery of the body portion, a field plate structure extending on an insulating layer over the body portion towards the outer periphery to spread a depletion layer from the reverse-biased p-n junction towards the outer periphery, and an annular channel stopper extending around the vicinity of the outer periphery to prevent the spread of the depletion layer to the outer periphery, characterised in that the field plate structure terminates on the insulating layer over the annular channel stopper, the annular channel stopper comprises concentrically doped stopper regions of the one conductivity type which are present in the body portion adjacent the said major surface and which have a higher conductivity type determining doping concentration than the body portion, and the concentrically doped stopper regions together give to the body portion adjacent the said major surface a non-uniform doping profile of the one conductivity type the doping of which, under the field plate structure, increases with distance towards the outer periphery to slow progressively the spread of the depletion layer under the field plate structure.

2. A device as claimed in claim 1, further characterised in that at least some of the doped stopper regions comprise concentric distinct regions of higher conductivity type determining dopant concentration than the body portion, which distinct regions are spaced from each other in the body portion by distances which are smaller towards the outer periphery than nearer the device region.

3. A device as claimed in claim 1, further characterised in that at least some of the doped stopper regions comprise concentric distinct regions of higher conductivity type determining dopant concentration than the body portion, which distinct regions are spaced from each other in the body portion and have widths which are larger for a distinct region towards the outer periphery than for a distinct region nearer the device region.

4. A device as claimed in claim 1, further characterised in that at least some of the concentrically doped stopper regions have different conductivity type determining dopant concentrations which are greater for a region towards the outer periphery than for a region nearer the device region.

5. A device as claimed in claim 4, further characterised in that at least some of the concentrically doped stopper regions merge laterally together to form a compound region for which the doping profile has a greater conductivity type determining dopant concentration towards the outer periphery than nearer the device region.

6. A device as claimed in claim 1, further characterised in that the field plate structure comprises a field plate connected to the device region.

7. A device as claimed in claim 1, further characterised in that there is present between the annular channel stopper and the device region at least one field region of the opposite conductivity type which surrounds the device region and forms with the body portion a p-n junction terminating at said major surface.

8. A device as claimed in claim 7, further characterised in that the field plate structure comprises a field plate connected to the field region of the opposite conductivity type.

9. A device as claimed in claim 1, further characterised in that the field plate structure extends laterally over the whole of the body portion between the device region and a doped stopper region of the annular channel stopper in the vicinity of the outer periphery of the body portion.

10. A device as claimed in claim 1, further characterised in that the semiconductor body is packaged in a plastics encapsulation.

* * * * *